United States Patent
Wu et al.

(10) Patent No.: US 9,355,054 B2
(45) Date of Patent: May 31, 2016

(54) DIGITAL CALIBRATION-BASED SKEW CANCELLATION FOR LONG-REACH MIPI D-PHY SERIAL LINKS

(71) Applicant: OmniVision Technologies, Inc., Santa Clara, CA (US)

(72) Inventors: Charles Qingle Wu, Palo Alto, CA (US); Min Liu, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 143 days.

(21) Appl. No.: 14/149,430

(22) Filed: Jan. 7, 2014

(65) Prior Publication Data

US 2015/0192949 A1    Jul. 9, 2015

(51) Int. Cl.
*G06F 1/08* (2006.01)
*G06F 13/40* (2006.01)
*G06F 1/10* (2006.01)
*G11C 7/10* (2006.01)
*G11C 29/02* (2006.01)
*H04L 7/00* (2006.01)
*H04L 7/033* (2006.01)

(52) U.S. Cl.
CPC ........ *G06F 13/40* (2013.01); *G06F 1/10* (2013.01); *G11C 7/1066* (2013.01); *G11C 7/1093* (2013.01); *G11C 29/022* (2013.01); *G11C 29/023* (2013.01); *G11C 29/028* (2013.01); *H04L 7/0004* (2013.01); *H04L 7/0008* (2013.01); *G11C 2207/2254* (2013.01); *H04L 7/0041* (2013.01); *H04L 7/033* (2013.01)

(58) Field of Classification Search
CPC ............ G06F 1/08; G06F 1/10; G06F 13/40; H04L 7/0004; H04L 7/0008; G11C 29/028; G11C 7/1066; G11C 7/1093; G11C 29/022; G11C 29/023

See application file for complete search history.

(56) References Cited

U.S. PATENT DOCUMENTS

| | | | |
|---|---|---|---|
| 6,622,256 B1 * | 9/2003 | Dabral ................. | H03K 5/1252 365/193 |
| 8,886,988 B2 * | 11/2014 | Lin ....................... | H04L 7/0041 370/516 |
| 2011/0267898 A1 * | 11/2011 | Yun ...................... | G11C 7/1066 365/189.05 |
| 2012/0294401 A1 | 11/2012 | Lin et al. | |

OTHER PUBLICATIONS

Taiwanese Patent Application 103143855 Office Action dated Nov. 3, 2015, received from our associates on Nov. 24, 2015, 9 pages.
Taiwanese Patent Application 103143855 Notice of Allowance dated Feb. 17, 2016, 3 pages.

* cited by examiner

*Primary Examiner* — Thuan Du
(74) *Attorney, Agent, or Firm* — Lathrop & Gage LLP

(57) ABSTRACT

A Mobile Industry Processor Interface (MIPI) physical layer (D-PHY) serial communication link and a method of reducing clock-data skew in a MIPI D-PHY serial communication link include apparatus including a clock transmitting circuit for transmitting a clock signal on a first lane of the MIPI D-PHY serial link, a data transmitting circuit for transmitting a data signal on a second lane of the MIPI D-PHY serial link, a clock receiving circuit for receiving the clock signal on the first lane of the MIPI D-PHY serial link, and a data receiving circuit for receiving the data signal on the second lane of the MIPI D-PHY serial link. The clock transmitting circuit and the data transmitting circuit transmit the clock signal and the data signal in phase during a calibration mode and out of phase during a normal operation mode.

18 Claims, 8 Drawing Sheets

DIGITAL CALIBRATION-BASED SKEW CANCELLATION FOR LONG-REACH MIPI D-PHY SERIAL LINKS

BACKGROUND

1. Technical Field

This disclosure is related to calibration of communication links and, more particularly, to skew cancellation in MIPI D-PHY serial links.

2. Discussion of Related Art

In mobile telephone technology, the Mobile Industry Processor Interface (MIPI) D-PHY (physical layer) serial link is the most prevalent and successful high-speed serial link standard used for chip-to-chip communication inside mobile telephones. Conventional MIPI D-PHY links operate at low power and have a relatively short reach, for example, in a printed circuit board (PCB) trace of less than approximately 30 cm. In conventional MIPI D-PHY links, a forward double data rate (DDR) clock scheme is employed for simplified and power-efficient receiver design. The high-speed DDR clock is typically transmitted in quadrature phase relation with the link data. Currently, the typical practical data speed limit is approximately 1.0 Gbs/lane.

In devices that are larger than mobile telephones, such as televisions, LCD displays, tablets/handheld devices, or other devices, a long-reach capability, i.e., longer than 2.0 m, is desirable. At current data speeds, data-clock skew can occur due to mismatch of the twisted pair conductors of clock and data lanes in the MIPI D-PHY serial links and due to CMOS-mismatch-induced phase offset from the transmit (Tx) circuit and the receiver (Rx) front receive end. In long-reach applications, the skew can be large enough to limit the maximum data rate of the link transmission.

SUMMARY

According to one aspect a Mobile Industry Processor Interface (MIPI) physical layer (D-PHY) serial communication link apparatus is provided. The serial link apparatus includes a clock transmitting circuit for transmitting a clock signal on a first lane of the MIPI D-PHY serial link; a data transmitting circuit for transmitting a data signal on a second lane of the MIPI D-PHY serial link; a clock receiving circuit for receiving the clock signal on the first lane of the MIPI D-PHY serial link; and a data receiving circuit for receiving the data signal on the second lane of the MIPI D-PHY serial link. The clock transmitting circuit and the data transmitting circuit are adapted to transmit the clock signal and the data signal in phase during a calibration mode and out of phase during a normal operation mode.

According to another aspect, a method of reducing clock-data skew in a Mobile Industry Processor Interface (MIPI) physical layer (D-PHY) serial communication link is provided. The method comprises: transmitting a clock signal on a first lane of the MIPI D-PHY serial link; transmitting a data signal on a second lane of the MIPI D-PHY serial link; receiving the clock signal on the first lane of the MIPI D-PHY serial link; and receiving the data signal on the second lane of the MIPI D-PHY serial link. The clock signal and the data signal are transmitted in phase during a calibration mode and out of phase during a normal operation mode.

BRIEF DESCRIPTION OF THE DRAWINGS

The foregoing and other features and advantages will be apparent from the more particular description of preferred embodiments, as illustrated in the accompanying drawings, in which like reference characters refer to the same parts throughout the different views. The drawings are not necessarily to scale, emphasis instead being placed upon illustrating the principles of the inventive concept.

FIG. 2A illustrates the timing of the signals in the ideal case, in which no clock-data skew is present. FIG. 2B illustrates the case in which clock-data skew is present.

DETAILED DESCRIPTION

Figure 1:
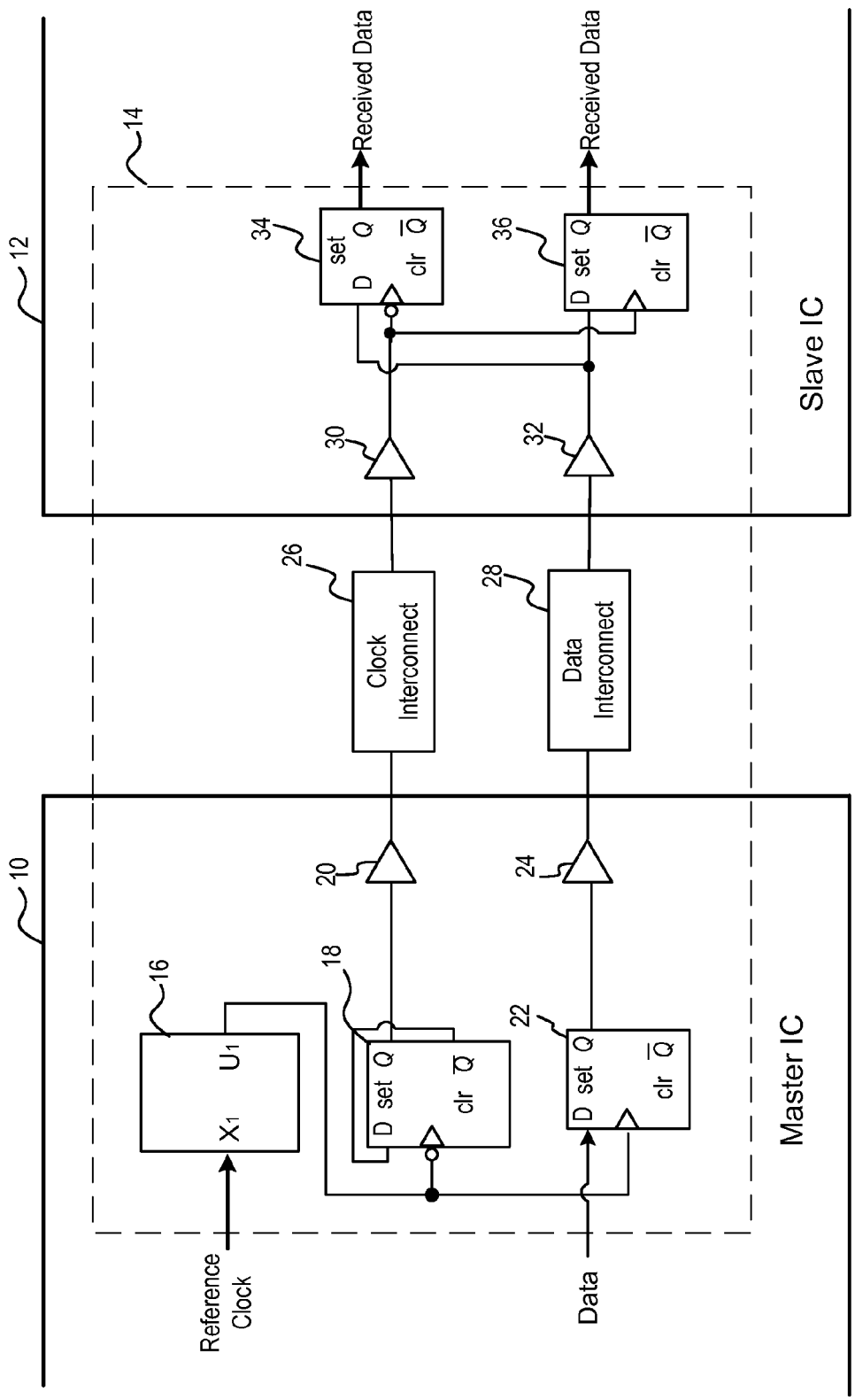
FIG. 1 includes a schematic block diagram of portions of two circuits, for example, integrated circuits (ICs), connected by a MIPI high-speed serial link.

FIG. 1 includes a schematic block diagram of portions of two circuits, for example, integrated circuits (ICs), connected by a MIPI high-speed serial link. Referring to FIG. 1, a first IC 10, which can be referred to as a "Master IC," is connected to and can communicate with a second IC 12 via a MIPI high-speed serial link 14. As illustrated in FIG. 1, a reference clock signal is input to a phase-locked loop (PLL) frequency multiplier 16, which outputs a bit rate clock signal. The bit rate clock signal is applied to a pair of D flip-flops 18 and 22, which trigger on the falling and rising edges of the bit rate clock signal, respectively. The /Q output of flip-flop 18 is applied to the D input of flip-flop 18, such that flip-flop 18 generates a double-data-rate (DDR) clock signal and outputs the DDR clock signal at its Q output. An input data signal is applied to the D input of flip-flop 22, which generates serial data from the input data signal and outputs the serial data signal at its Q output. The DDR clock signal is driven by a driver 20 onto a clock interconnect lane, indicated by reference numeral 26, which conducts the DDR clock signal to second or slave IC 12. Similarly, the serial data signal is driven by a driver 24 onto a data interconnect lane, indicated by reference numeral 28, which conducts the serial data signal to second or slave IC 12.

Second or slave IC 12 includes a first receiver 30, which receives the DDR clock signal from first or master IC 10, and a second receiver 32, which receives the serial data signal from first or master IC 10. Second IC 12 includes a pair of D flip-flops 34 and 36. The DDR clock signal is applied to the clock inputs of both D flip-flops 34 and 36, such that D flip-flop 34 is triggered on the falling edge of the DDR clock signal, and D flip-flop 36 is triggered on the rising edge of the DDR clock signal. The serial data signal is applied to the D inputs of both D flip-flops 34 and 36. Serial data from the serial data signal is therefore clocked through D flip-flops 34 and 36 such that the serial data from the serial data signal appears as received data at the Q outputs of D flip-flops 34 and 36 at double the data rate of the serial data signal.

Figure 2A:
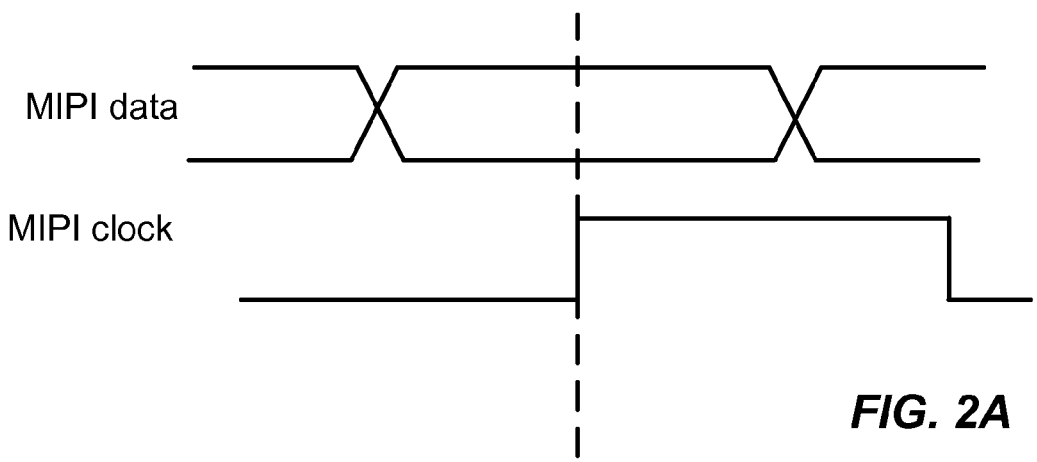
FIGS. 2A and 2B include timing diagrams illustrating exemplary timing of the data signal and the clock signal in a MIPI serial data link.
Figure 2B:
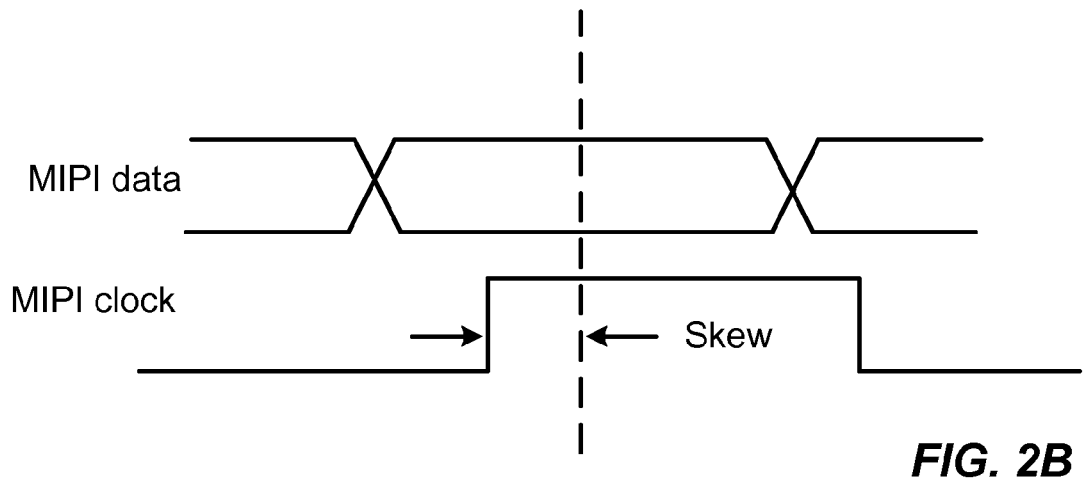

FIGS. 2A and 2B include timing diagrams illustrating exemplary timing of the data signal and the clock signal in a MIPI serial data link. In FIGS. 2A and 2B, the data signal is labeled "MIPI data" and the clock signal is labeled "MIPI clock." FIG. 2A illustrates the timing of the signals in the ideal case, in which no clock-data skew is present. The vertical dashed line indicates the rising edge of the clock signal, which triggers the sampling of the data signal. As shown in FIG. 2A, in the absence of clock-data skew, the data signal is ideally sampled in the middle of its active time interval.

In contrast, FIG. 2B illustrates the case in which clock-data skew is present. This skew can be introduced, for example, by long-reach applications, such as where clock interconnect 26 and data interconnect 28 are longer than 30 cm, for example, approximately 2.0 meters or longer. In this case, the rising edge of the clock signal, and, therefore, the sampling of the data signal, does not occur in the middle of the data-active period of the data signal. Instead, the clock-data skew results in the data sampling occurring off-canter. As the clock-data skew increases, the probability of sampling errors also increases.

Figure 3A:
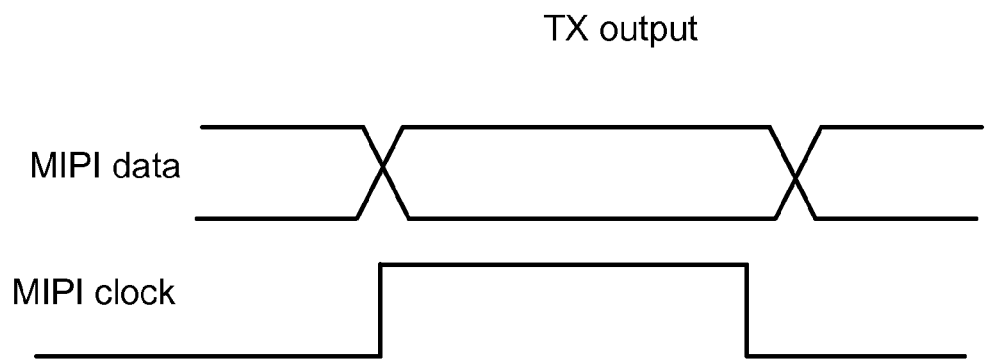
FIGS. 3A and 3B include timing diagrams of the data signal and clock signal used according to the exemplary embodiments to carry out the deskew calibration of the exemplary embodiments.
Figure 3B:
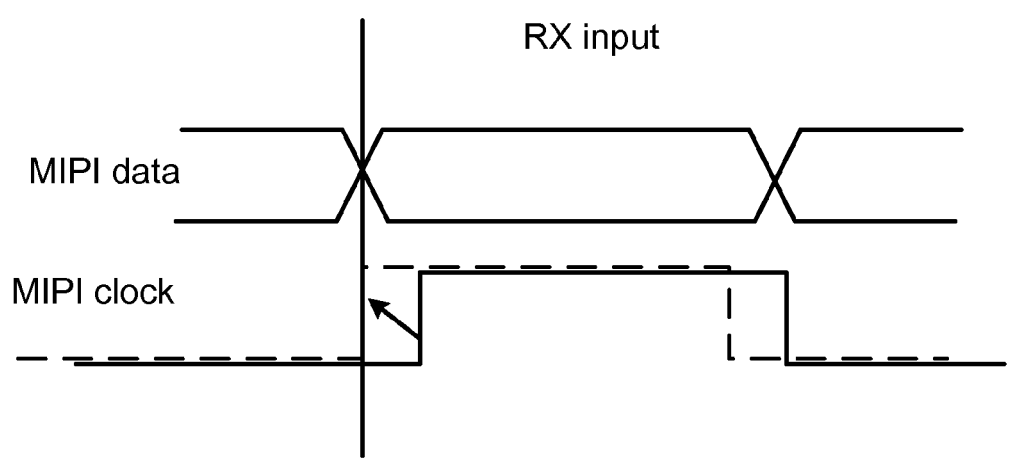

In accordance with the exemplary embodiments, the MIPI serial data link is calibrated such that the clock-data skew is removed or substantially reduced. This results in reduction of data sampling errors in high-speed operation in long-reach applications of the MIPI serial data link. FIGS. 3A and 3B include timing diagrams of the data signal and clock signal used according to the exemplary embodiments to carry out the deskew calibration of the exemplary embodiments. Specifically, FIG. 3A includes a schematic timing diagram illustrating timing of the data signal (MIPI data) and clock signal (MIPI clock) generated and transmitted at the transmit end of a MIPI serial data link, for example, first IC 10 illustrated in FIG. 1, in a calibration mode during a deskew calibration procedure, according to exemplary embodiments. FIG. 3B includes a schematic timing diagram illustrating timing of the data signal (MIPI data) and clock signal (MIPI clock) received at the receive end of the MIPI serial data link, for example, second IC 12 in FIG. 1, in a calibration mode during a deskew calibration procedure, according to exemplary embodiments.

Referring to FIG. 3A, it is noted that, according to the exemplary embodiments, during a deskew calibration operation, in which the MIPI serial link is operated in a calibration mode, the data signal and clock signal are transmitted in phase. This is in contrast with normal operation, in which the MIPI serial link is operated in a normal operation mode, in which the data signal and clock signal are transmitted out of phase, specifically, 90 degrees out of phase, or, equivalently, in quadrature.

Referring to FIG. 3B, according to exemplary embodiments, when the MIPI serial link is operated in the calibration mode, the data signal and clock signal received at the receive end of the MIPI serial link, exhibit clock-data skew. This skew is illustrated in the solid-line MIPI clock waveform illustrated in FIG. 3B. According to the exemplary embodiments, a calibration procedure is performed in which a deskew calibration phase delay is determined. This calibration phase delay would result in the clock-data skew being eliminated, as illustrated in the dashed-line MIPI clock waveform illustrated in FIG. 3B.

Figure 4:
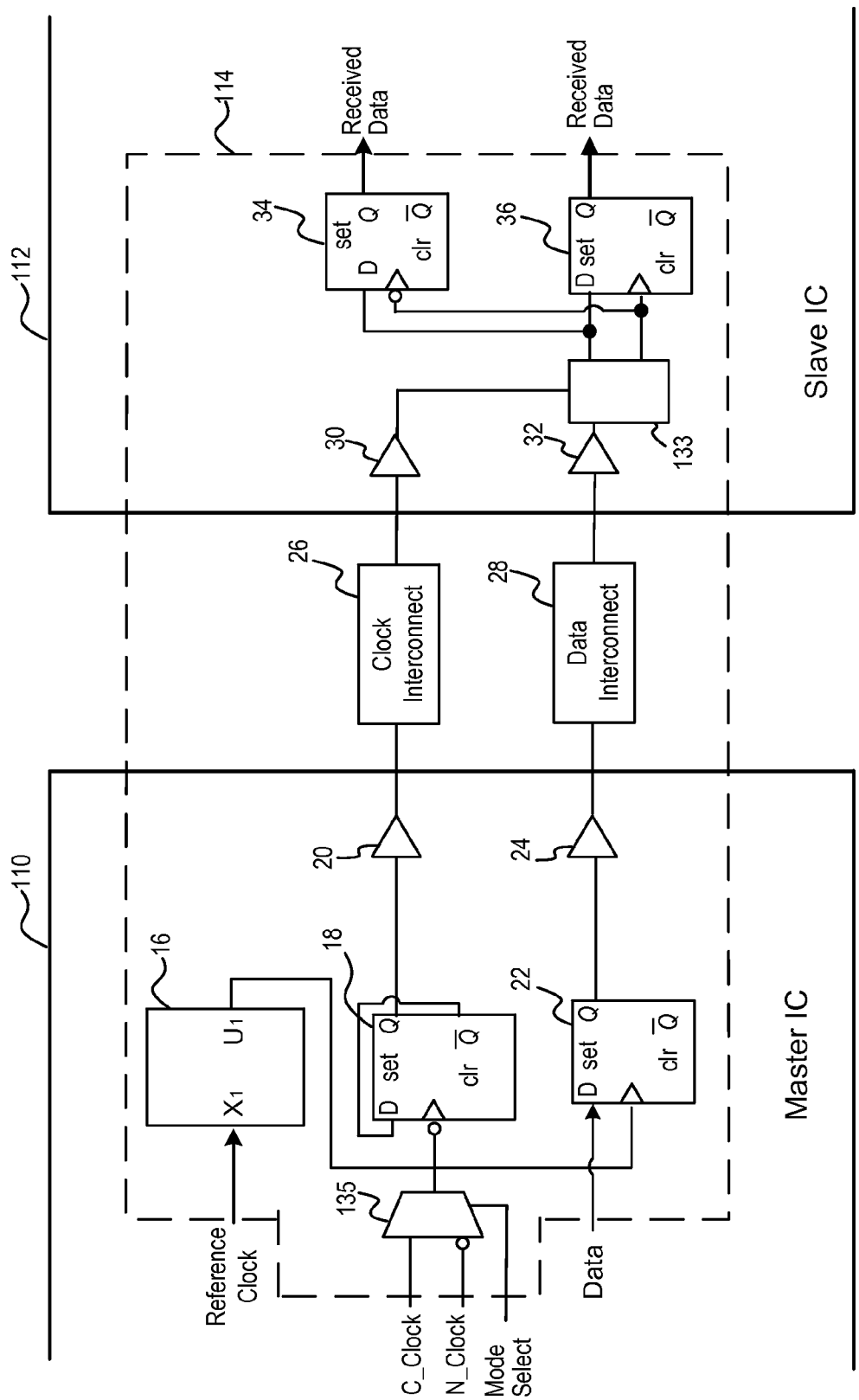
FIG. 4 includes a schematic block diagram of portions of two circuits, for example, integrated circuits (ICs), connected by a MIPI high-speed serial link, according to some exemplary embodiments.

FIG. 4 includes a schematic block diagram of portions of two circuits, for example, integrated circuits (ICs), connected by a MIPI high-speed serial link, according to some exemplary embodiments. It will be noted that elements common to the system illustrated in FIG. 1 and the system of FIG. 4 are indicated by the same reference numerals. Detailed description of these like elements will not be repeated.

Referring to FIG. 4, first or master IC 110 includes a selection circuit, for example, multiplexer 135, which selects between a deskew calibration clock signal C_Clock applied to a first input of multiplexer 135 and a normal operational mode clock N_Clock applied to a second input of multiplexer 135. The selection is effected by a Mode_Select signal applied to the selection control input of multiplexer 135. According to some exemplary embodiments, as described above, the deskew calibration clock signal C-Clock is in phase with the data signal. In the deskew calibration mode, the Mode_Select signal is set to select the deskew calibration clock signal C_Clock, which is applied by the output of multiplexer 135 to the clock input of D flip-flop 18. Also, in some exemplary embodiments, the serial data applied as the data signal at the D input of D flip-flop 22 is in a predetermined fixed pattern. For example, in some embodiments, in order to match the DDR clock signal, the fixed data pattern of the data signal can be selected to be 101010101010 . . . . In some exemplary embodiments, the fixed data pattern can be selected to have a short 1010 pattern followed by a pattern of relatively alternating long 1s and 0s, for example, 101011110000 . . . . In this case, the short 1s and 0s followed by the long 1s and 0s are used to calibrate out inter-symbol interference (ISI) link jitter.

Continuing to refer to FIG. 4, second or slave IC 112 includes a deskew calibration block 133, which receives the clock signal and data signal. During the deskew calibration procedure in the deskew calibration mode, deskew calibration block 133 detects the phase difference between the received clock signal and the received data signal. Since they were transmitted from first IC 110 in phase, the phase difference detected in deskew calibration block 133 indicates skew introduced in link 114. The phase difference, i.e., clock-data skew, detected during deskew calibration is stored and used subsequently by deskew calibration block 133 during the subsequent normal operational mode to compensate for the clock-data skew introduced in link 114, thus eliminating or substantially reducing clock-data skew during normal operation.

Figure 5:
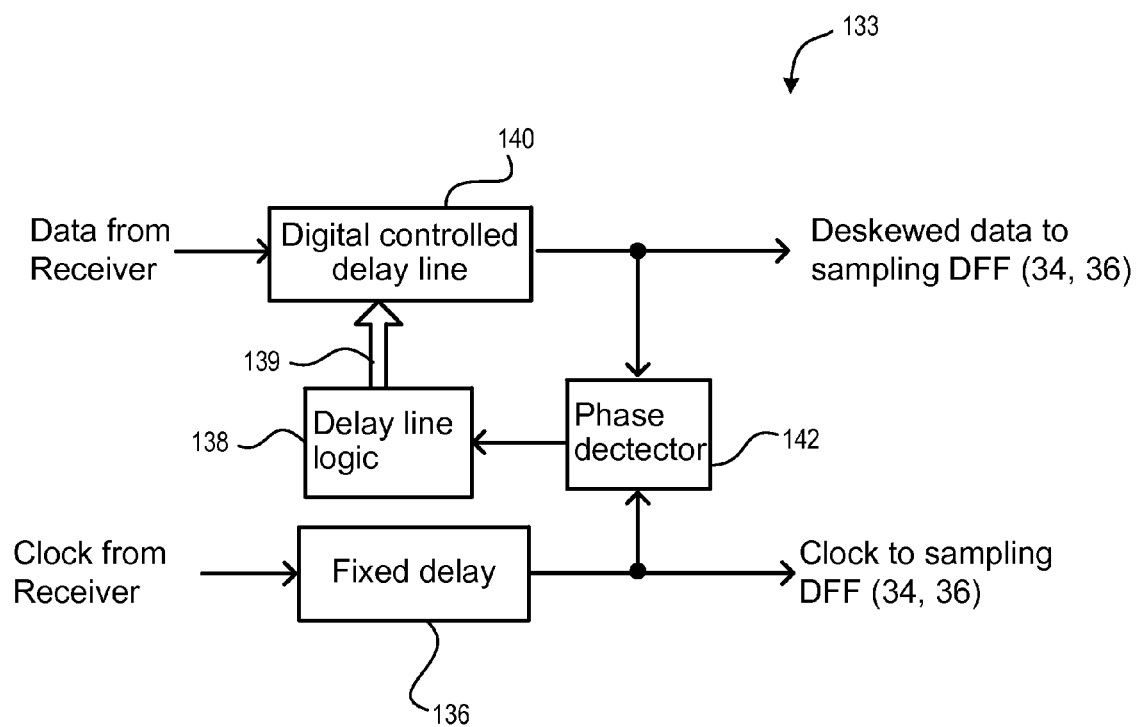
FIG. 5 includes a detailed schematic block diagram of a deskew calibration block, according to exemplary embodiments.

FIG. 5 includes a detailed schematic block diagram of deskew calibration block 133, according to exemplary embodiments. Referring to FIG. 5, during the deskew calibration procedure in the deskew calibration mode, deskew calibration block 133 detects a phase difference between the received clock signal and the received data signal, and uses that detected phase difference to deskew the received clock signal and the received data signal during the subsequent normal operation of the serial link. Calibration block 133 includes a fixed delay 136 which receives the clock signal from receiver 30 and introduces a fixed delay into the clock signal. The delayed clock signal is output to the clock inputs of data sampling D flip-flops (DFF) 34 and 36. It is noted that fixed delay 136 may be an actual electronic component, such as a delay line, which introduces a delay into the clock signal, or fixed delay 136 may represent delay that is inherent in the clock signal connections.

The data signal is received from receiver 32 by deskew calibration block 133 at a digitally-controlled delay line 140. Digitally-controlled delay line 140 introduces a controlled amount of delay into the received data signal and outputs the resulting delayed data signal, which is forwarded to data sampling D flip-flops (DFF) 34 and 36. The amount of delay introduced by digitally-controlled delay line 140 is controlled by a delay control value input at a delay control input via delay control lines 139.

As described above, during the deskew calibration procedure, in the deskew calibration mode, the clock signal and data signal are transmitted in phase. Accordingly, any phase difference between the received clock signal and the received data signal is indicative of an amount of clock-data skew in the serial link. A phase detector 142 detects the difference in phase between the received clock signal phase shifted by fixed delay 136 and the received data signal phase shifted by digitally-controlled delay line 140. Phase detector 142 outputs a signal indicative of this detected phase difference to delay line logic 138, which uses the detected phase difference to generate a delay control value, which is transmitted via delay control lines 139 to digitally-controlled delay line 140. During the deskew calibration procedure in the deskew calibration mode, this closed feedback loop adjusts the phase of the received data signal until the phase difference between the received data signal and the delayed received clock signal is below a predetermined maximum threshold. At this point, the clock-data skew in the serial link has been removed.

After the above calibration procedure is completed, the serial link can enter the normal operational mode. In this mode, the deskew calibration adjustment programmed into digitally-controlled delay line 140 during the deskew calibration procedure continues to adjust the phase of the received data signal. In the normal operational mode, in the MIPI serial data link, the data signal and clock signal are transmitted out-of-phase, e.g., in quadrature. With the deskew calibration phase adjustment programmed into digitally-controlled delay line 140, clock-data skew during normal operation is calibrated out of the serial data link. Clock-data skew is substantially reduced or eliminated.

Figure 6:
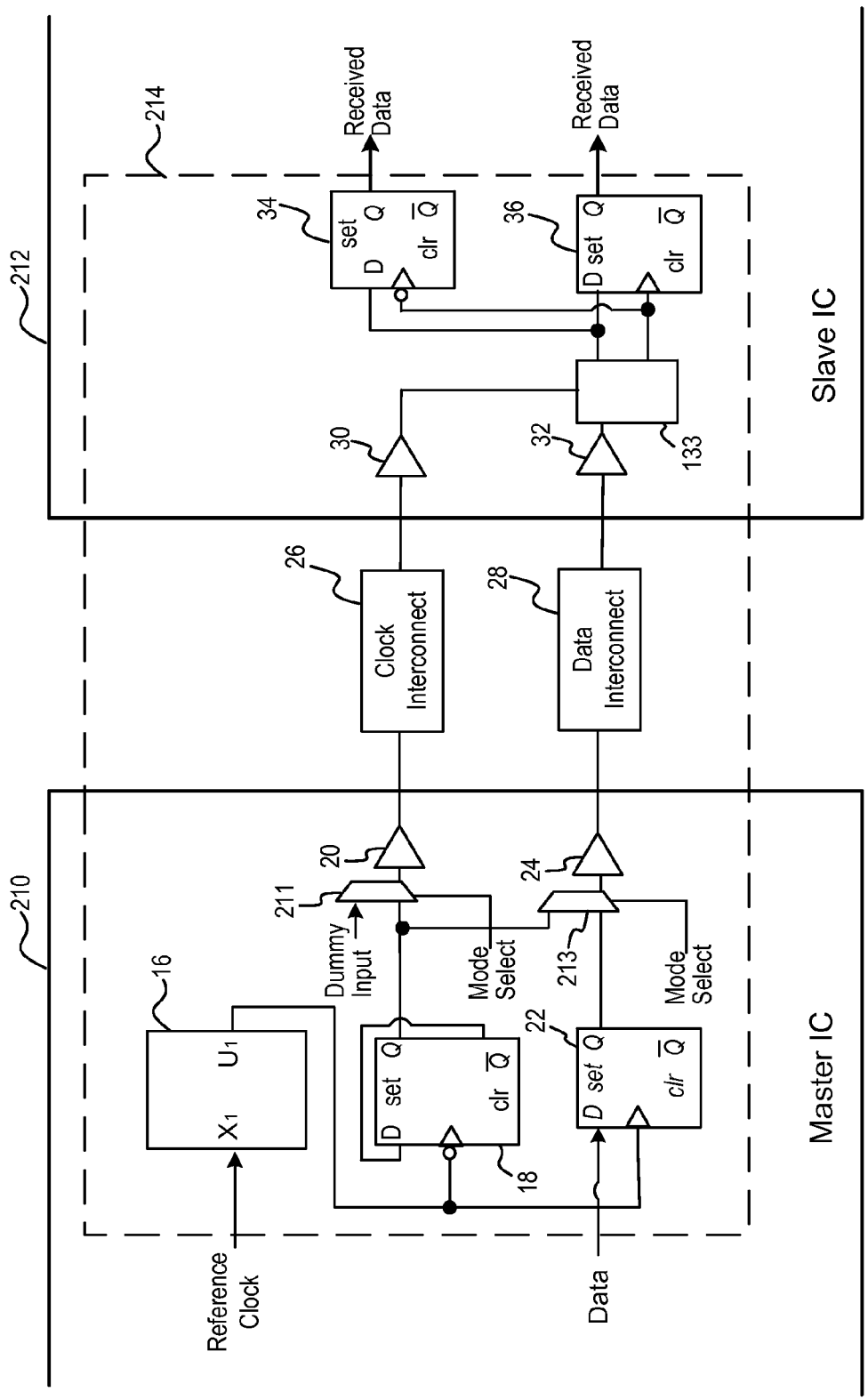
FIG. 6 includes a schematic block diagram of portions of two circuits, for example, integrated circuits (ICs), connected by a MIPI high-speed serial link, according to some other exemplary embodiments.

FIG. 6 includes a schematic block diagram of portions of two circuits, for example, integrated circuits (ICs), connected by a MIPI high-speed serial link, according to some other exemplary embodiments. It will be noted that elements common to the systems illustrated in FIGS. 1 and 4 and the system of FIG. 6 are indicated by the same reference numerals. Detailed description of these like elements will not be repeated.

Referring to FIG. 6, in some exemplary embodiments, during the deskew calibration procedure, instead of transmitting the data signal and clock signal in phase, as in the embodiment of FIG. 4, the clock signal is routed to the data lane of serial link 214, such that the clock signal is transmitted over both the clock lane and the data lane simultaneously. To effect this deskew calibration approach, first or master IC 210 includes a pair of selection circuits, for example, multiplexers 211 and 213. Multiplexer 213 is used to select whether the data signal or the clock signal is transferred over the data lane of serial link 214. To that end, the data signal from D flip-flop 22 is applied to one of the inputs of multiplexer 213, and the clock signal from D flip-flop 18 is applied to the other input of multiplexer 213. The Mode Select signal applied to the selection input of multiplexer 213 selects one of the two signals to be output from multiplexer 213 to be applied to the data lane of serial link 214. During the calibration mode, the Mode Select signal is set to a logic level which results in selection of the clock signal from D flip-flop 18, and during the normal operational mode, the Mode Select signal is set to the opposite logic level, i.e., the logic level which results in selection of the data signal from D flip-flop 22.

Multiplexer 211 is included so that the clock and data channels have similar delays, or in other words, so that the clock channel includes a delay similar to the delay introduced by multiplexer 213 into the data channel. Multiplexer 211 receives the clock signal output from D flip-flop 18 as one of its inputs and a dummy signal, e.g., either a continuously high or low signal, as the other of its inputs. The Mode Select signal to multiplexer 211 is set to a logic level which results in selection of the clock signal from D flip-flop 18, during both the normal and calibration operational modes.

The remainder of serial link 214 of FIG. 6 is the same in form and function as that described above in connection with FIG. 4. For example, second or slave IC 212 includes deskew calibration block 133 described above in detail in connection with FIGS. 4 and 5.

Figure 7:
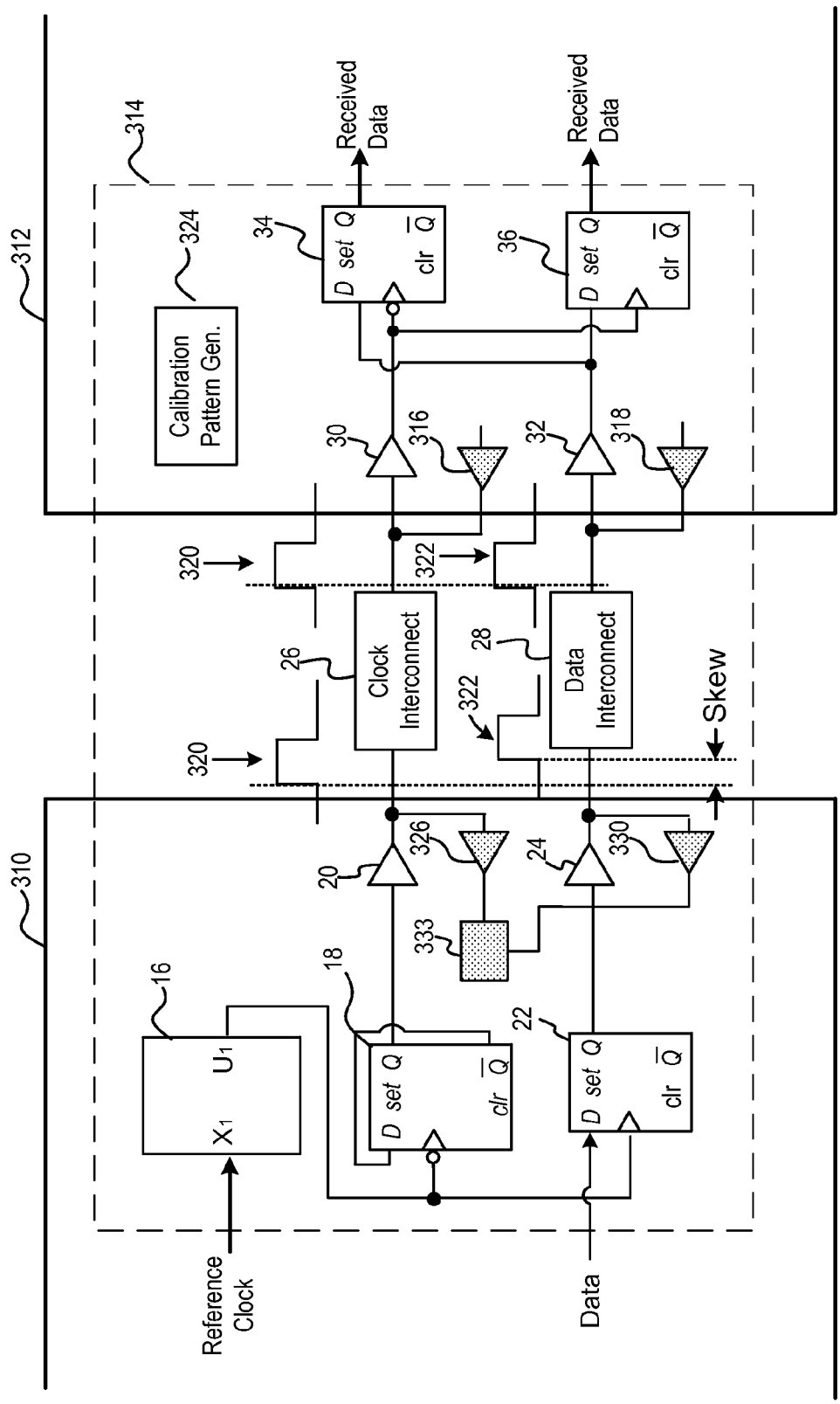
FIG. 7 includes a schematic block diagram of portions of two circuits, for example, integrated circuits (ICs), connected by a MIPI high-speed serial link, according to some other exemplary embodiments.

FIG. 7 includes a schematic block diagram of portions of two circuits, for example, integrated circuits (ICs), connected by a MIPI high-speed serial link, according to some other exemplary embodiments. It will be noted that elements common to the systems illustrated in FIGS. 1, 4 and 6 and the system of FIG. 7 are indicated by the same reference numerals. Detailed description of these like elements will not be repeated.

Referring to FIG. 7, serial link 314 operates in a manner similar to serial link 114 (FIG. 4) during the normal operational mode. In the calibration mode, however, serial link 314 transfers data in a "backward" direction, i.e., from a second IC 312 to a first IC 310. Specifically, drivers 316 and 318 of second IC 312 generate calibration data patterns 320 and 322, respectively, under the control of a calibration data generator 324, during the calibration mode. Calibration data patterns 320 and 322 are in phase with each other at second IC 312, and in some embodiments, each calibration data pattern 320, 322 forms an alternating 1s and 0s pattern. Calibration data patterns 320 and 322 are transmitted by clock interconnect lane 26 and data interconnect lane 28, respectively, from second IC 312 to first IC 310. Receivers 326 and 330 in first IC 310 receive calibration data pattern 320 and 322, respectively, at first IC 310. A deskew calibration block 333 determines a skew, or a phase difference, between calibration data patterns 320 and 322 at first IC 310. Deskew calibration block 333 applies the phase difference to the data signal and/or the clock signal during the normal operational mode, thus eliminating or substantially reducing clock-data skew during normal operation. In some embodiments, deskew calibration block 333 is distributed between first IC 310 and second IC 312.

Accordingly, transmitting circuitry is distributed between first IC 310 and second IC 312. For example, flip-flop 18 and driver 20 form at least part of a clock transmitting circuit in the normal operation mode, and driver 316 and calibration data generator 324 form at least part of a clock transmitting circuit in the calibration mode. Additionally, flip-flop 22 and driver 24 form at least part of a data transmitting circuit in the normal operation mode, and driver 318 and calibration data generator 324 form at least part of a data transmitting circuit in the calibration mode. Similarly, receiving circuitry is distributed between first IC 310 and second IC 312. For example, receiver 30 and flip-flop 34 form at least part of a clock receiving circuit in the normal operation mode, and receiver 326 forms at least part of a clock receiving circuit in the calibration mode. Additionally, receiver 32 and flip-flop 36 form at least part of a data receiving circuit in the normal operation mode, and receiver 330 forms at least part of a data receiving circuit in the calibration mode. The clock signal and the data signal are transmitted on clock interconnect lane 26 and data interconnect lane 28, respectively, in a first direction (left to right) in the normal operation mode. Conversely, the clock signal and the data signal are transmitted on clock interconnect lane 26 and data interconnect lane 28, respectively, in a second direction (right to left), opposite of the first direction, in the calibration mode.

Serial link 314 is capable of correcting for skew introduced by differences between clock interconnect lane 26 and data interconnect lane 28, but not for skew introduced by other components of serial link 314. Accordingly, serial link 314 may be suitable use in applications where interconnect lane skew dominates clock-data skew.

Figure 8:
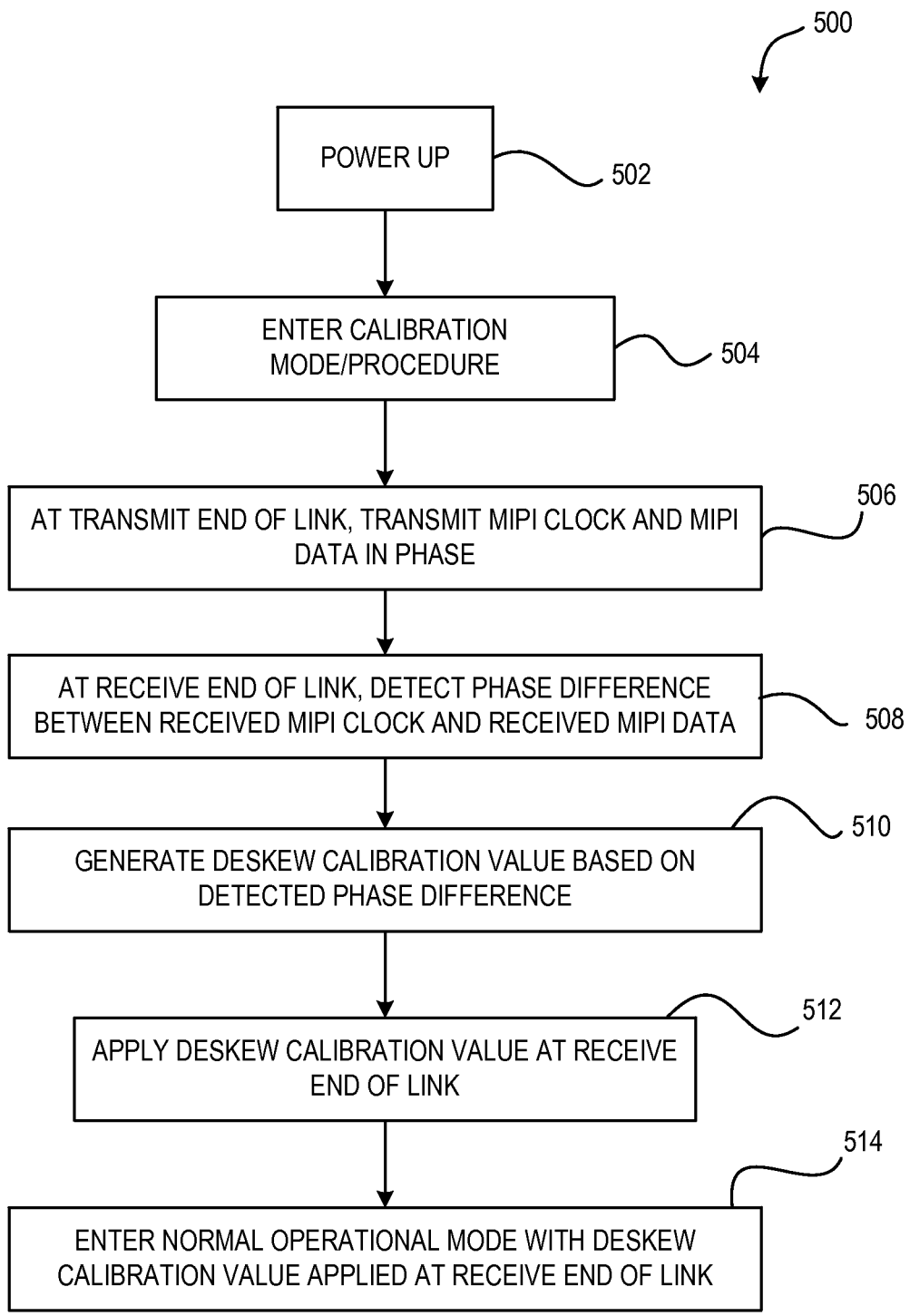
FIG. 8 includes a logical flow diagram which illustrates logical flow of a deskew calibration process, according to some exemplary embodiments.

FIG. 8 includes a logical flow diagram which illustrates logical flow of a deskew calibration process, according to some exemplary embodiments. Referring to FIG. 8, in some exemplary embodiments, the deskew calibration process 500 is initiated immediately upon system or serial link power up, in step 502. The calibration mode/procedure is entered in step 504. In step 506, at the transmit end of the serial link, the MIPI clock signal and MIPI data signals are transmitted on the serial link in phase. In step 508, at the receive end of the serial link, the phase difference between the received MIPI clock signal and the received MIPI data signal is detected. In step 510, a deskew calibration value based on the detected phase difference is detected. In step 512, the deskew calibration value is applied at the receive end of the serial link, such as, for example, by the delay control value input at the delay control input of digitally-controlled delay line 140 via delay control lines 139. In step 514, normal operational mode is entered with the deskew calibration value determined during the calibration procedure applied at the receive end of the link.

Combinations of Features

Various features of the present disclosure have been described above in detail. The disclosure covers any and all combinations of any number of the features described herein, unless the description specifically excludes a combination of features. The following examples illustrate some of the combinations of features contemplated and disclosed herein in accordance with this disclosure.

In any of the embodiments described in detail and/or claimed herein, in the normal operation mode, the clock signal and the data signal are transmitted in quadrature.

In any of the embodiments described in detail and/or claimed herein, in the calibration mode, the data signal comprises data in a predetermined calibration data pattern.

In any of the embodiments described in detail and/or claimed herein, the predetermined calibration pattern is such that at least a portion of the data signal includes time periods in which level transitions in the data signal are substantially the same in time as level transitions of the clock signal.

In any of the embodiments described in detail and/or claimed herein, the predetermined calibration pattern is such that at least a portion of the data signal includes time periods in which a logical level of the data signal is held constant for a plurality of periods of the clock signal.

In any of the embodiments described in detail and/or claimed herein, the serial link further comprises a deskew calibration circuit coupled to the data receiving circuit and the clock receiving circuit for receiving the data signal and the clock signal in the calibration mode and, in the calibration mode, adjusting phase of at least one of the data signal and the clock signal such that a phase difference is below a threshold.

In any of the embodiments described in detail and/or claimed herein, the deskew calibration circuit comprises an adjustable delay line circuit for adjusting phase of the at least one of the data signal and the clock signal.

In any of the embodiments described in detail and/or claimed herein, in the normal operation mode, the adjustable delay line circuit introduces delay into at least one of the clock signal and the data signal, the delay being determined in the calibration mode by adjusting phase of the at least one of the data signal and the clock signal.

In any of the embodiments described in detail and/or claimed herein, the clock transmitting circuit and the data transmitting circuit are configured such that the data signal and the clock signal are derived from the same signal.

In any of the embodiments described in detail and/or claimed herein, in the calibration mode, the data signal and the clock signal are derived from the same signal.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A Mobile Industry Processor Interface (MIPI) physical layer (D-PHY) serial communication link apparatus, comprising:
    a clock transmitting circuit for transmitting a clock signal on a first lane of the MIPI D-PHY serial link;
    a data transmitting circuit for transmitting a data signal on a second lane of the MIPI D-PHY serial link;
    a clock receiving circuit for receiving the clock signal on the first lane of the MIPI D-PHY serial link; and
    a data receiving circuit for receiving the data signal on the second lane of the MIPI D-PHY serial link; wherein:
    the clock transmitting circuit and the data transmitting circuit are adapted to transmit the clock signal and the data signal in phase during a calibration mode;
    the clock transmitting circuit and the data transmitting circuit are adapted to transmit the clock signal and the data signal out of phase during a normal operation mode;
    the clock signal and the data signal are transmitted in a first direction on the first lane and the second lane, respectively, in the normal operation mode;
    the clock signal and the data signal are transmitted in a second direction on the first lane and the second lane, respectively, in the calibration mode; and
    the second direction is opposite of the first direction.

2. The apparatus of claim 1, wherein, in the normal operation mode, the clock signal and the data signal are transmitted in quadrature.

3. The apparatus of claim 1, wherein, in the calibration mode, the data signal comprises data in a predetermined calibration data pattern.

4. The apparatus of claim 3, wherein the predetermined calibration pattern is such that at least a portion of the data signal includes time periods in which level transitions in the data signal are substantially the same in time as level transitions of the clock signal.

5. The apparatus of claim 3, wherein the predetermined calibration pattern is such that at least a portion of the data signal includes time periods in which a logical level of the data signal is held constant for a plurality of periods of the clock signal.

6. The apparatus of claim 1, further comprising a deskew calibration circuit coupled to the data receiving circuit and the clock receiving circuit for receiving the data signal and the clock signal in the calibration mode and, in the calibration mode, adjusting phase of at least one of the data signal and the clock signal such that a phase difference is below a threshold.

7. The apparatus of claim 6, wherein the deskew calibration circuit comprises an adjustable delay line circuit for adjusting phase of the at least one of the data signal and the clock signal.

8. The apparatus of claim 7, wherein, in the normal operation mode, the adjustable delay line circuit introduces delay into at least one of the clock signal and the data signal, the delay being determined in the calibration mode by adjusting phase of the at least one of the data signal and the clock signal.

9. The apparatus of claim 1, wherein the clock transmitting circuit and the data transmitting circuit are configured such that the data signal and the clock signal are derived from the same signal.

10. A method of reducing clock-data skew in a Mobile Industry Processor Interface (MIPI) physical layer (D-PHY) serial communication link, the method comprising:
- transmitting a clock signal on a first lane of the MIPI D-PHY serial link;
- transmitting a data signal on a second lane of the MIPI D-PHY serial link;
- receiving the clock signal on the first lane of the MIPI D-PHY serial link; and
- receiving the data signal on the second lane of the MIPI D-PHY serial link; wherein:
- the clock signal and the data signal are transmitted in phase during a calibration mode;
- the clock signal and the data signal are transmitted out of phase during a normal operation mode;
- the clock signal and the data signal are transmitted in a first direction on the first lane and the second lane, respectively, in the normal operation mode;
- the clock signal and the data signal are transmitted in a second direction on the first lane and the second lane, respectively, in the calibration mode; and
- the second direction is opposite of the first direction.

11. The method of claim 10, wherein, in the normal operation mode, the clock signal and the data signal are transmitted in quadrature.

12. The method of claim 10, wherein, in the calibration mode, the data signal comprises data in a predetermined calibration data pattern.

13. The method of claim 12, wherein the predetermined calibration pattern is such that at least a portion of the data signal includes time periods in which level transitions in the data signal are substantially the same in time as level transitions of the clock signal.

14. The method of claim 12, wherein the predetermined calibration pattern is such that at least a portion of the data signal includes time periods in which a logical level of the data signal is held constant for a plurality of periods of the clock signal.

15. The method of claim 10, further comprising, in the calibration mode, adjusting phase of at least one of the data signal and the clock signal such that a phase difference is below a threshold.

16. The method of claim 15, wherein adjusting phase of the at least one of the data signal and the clock signal comprises adjusting an adjustable delay line circuit.

17. The method of claim 16, wherein, in the normal operation mode, the adjustable delay line circuit introduces delay into at least one of the clock signal and the data signal, the delay being determined in the calibration mode by adjusting phase of the at least one of the data signal and the clock signal.

18. The method of claim 10, wherein, in the calibration mode, the data signal and the clock signal are derived from the same signal.

* * * * *